(12) United States Patent
Liu et al.

(10) Patent No.: US 11,604,214 B2
(45) Date of Patent: Mar. 14, 2023

(54) CURRENT DETECTION DEVICE

(71) Applicants: Kabushiki Kaisha Toshiba, Tokyo (JP); Toshiba Electronic Devices & Storage Corporation, Tokyo (JP)

(72) Inventors: Jia Liu, Yokohama Kanagawa (JP); Toshihiro Tsujimura, Ota Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 711 days.

(21) Appl. No.: 16/518,142

(22) Filed: Jul. 22, 2019

(65) Prior Publication Data
US 2020/0292584 A1    Sep. 17, 2020

(30) Foreign Application Priority Data
Mar. 13, 2019  (JP) .............................. JP2019-046220

(51) Int. Cl.
*H05K 1/14*    (2006.01)
*G01R 15/20*   (2006.01)
*G01R 15/18*   (2006.01)
*H05K 1/18*    (2006.01)

(52) U.S. Cl.
CPC ........... *G01R 15/202* (2013.01); *G01R 15/18* (2013.01); *H05K 1/144* (2013.01); *H05K 1/183* (2013.01); *H05K 2201/1003* (2013.01); *H05K 2201/10151* (2013.01)

(58) Field of Classification Search
CPC combination set(s) only.
See application file for complete search history.

(56) References Cited

U.S. PATENT DOCUMENTS

| | | | |
|---|---|---|---|
| 2005/0012192 A1* | 1/2005 | Saso | H01L 23/552 257/E23.114 |
| 2007/0121249 A1* | 5/2007 | Parker | G11C 11/16 360/123.1 |
| 2009/0008134 A1* | 1/2009 | Tsuneoka | H05K 1/144 174/255 |
| 2009/0057800 A1* | 3/2009 | Suzuki | H05K 1/141 257/434 |
| 2015/0108967 A1* | 4/2015 | Barczyk | G01R 15/183 324/202 |
| 2019/0170795 A1 | 6/2019 | Sugito et al. | |
| 2019/0364663 A1* | 11/2019 | Yosui | H05K 1/115 |

(Continued)

FOREIGN PATENT DOCUMENTS

| | | | |
|---|---|---|---|
| JP | 2011-145273 A | 7/2011 | |
| JP | 5651057 B2 | 1/2015 | |

(Continued)

*Primary Examiner* — Paresh Paghadal
(74) *Attorney, Agent, or Firm* — Allen & Overy LLP (57) ABSTRACT

Provided is a current detection device including a first stacked board; a second stacked board provided on a first region on the first stacked board; a third stacked board provided on a second region on the first stacked board; a magnetic measurement element provided in a third region on the first stacked board, the magnetic element provided between the first region and the second region; and a first coil provided on the magnetic measurement element or below the magnetic measurement element.

17 Claims, 6 Drawing Sheets

(56) References Cited

U.S. PATENT DOCUMENTS

| | | | |
|---|---|---|---|
| 2021/0127494 A1* | 4/2021 | Choi | H05K 1/115 |
| 2021/0149150 A1* | 5/2021 | Park | G02B 7/09 |
| 2022/0246840 A1* | 8/2022 | Schmidt | G01R 33/077 |

FOREIGN PATENT DOCUMENTS

| | | |
|---|---|---|
| JP | 5771129 B2 | 8/2015 |
| JP | 2016-017830 A | 2/2016 |
| JP | 2018-081026 A | 5/2018 |

* cited by examiner

CURRENT DETECTION DEVICE

CROSS-REFERENCE TO RELATED APPLICATION

This application is based upon and claims the benefit of priority from Japanese Patent Application No. 2019-046220, filed on Mar. 13, 2019, the entire contents of which are incorporated herein by reference.

FIELD

Embodiments described herein relate generally to a current detection device.

BACKGROUND

A current detection device detects a magnetic field generated by a current flowing in a coil by using a magnetic measurement element such as a Hall element. For example, in the case of detecting the magnetic field by using the Hall element, the current detection device converts an intensity of the current flowing in the coil into a voltage.

In order to obtain a high magnetic field strength, two coils are disposed opposite to each other, and a magnetic measurement element is disposed between the two coils.

DETAILED DESCRIPTION

Hereinafter, embodiments will be described with reference to the drawings. In the drawings, the same or similar components are denoted by the same or similar reference numerals.

In the present specification, the same or similar members will be denoted by the same reference numerals, and redundant descriptions may be omitted.

In the present specification, in order to indicate the positional relationship of parts and the like, the upper direction of the drawing is described as "upper" and the lower direction of the drawing as "lower". In the present specification, the terms "upper" and "lower" are not necessarily terms indicating the relationship with the direction of gravity.

First Embodiment

A current detection device according to the present embodiment includes a first stacked board; a second stacked board provided on a first region on the first stacked board; a third stacked board provided on a second region on the first stacked board; a magnetic measurement element provided in a third region on the first stacked board, the magnetic element provided between the first region and the second region; and a first coil provided on the magnetic measurement element or below the magnetic measurement element.

Figure 1:
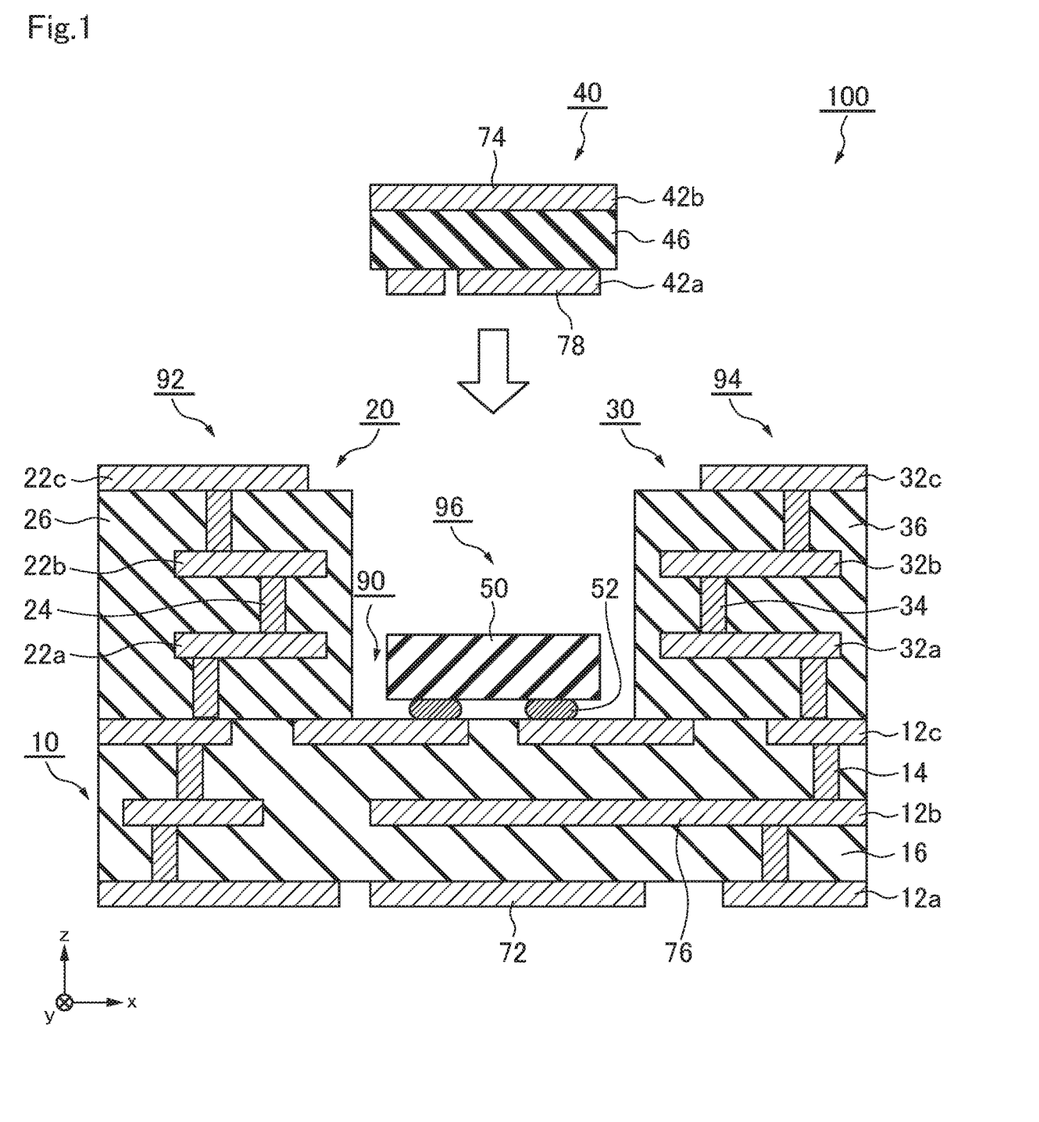
FIG. 1 is a schematic cross-sectional view of a current detection device according to a first embodiment.

FIG. 1 is a schematic cross-sectional view of a current detection device 100 according to the present embodiment.

Herein, an x-axis, a y-axis perpendicular to the x-axis, and a z-axis perpendicular to the x-axis and the y-axis are defined.

A first stacked board 10 includes a first conductive layer 12, a first connection conductor 14, and a first insulating layer 16.

A first conductive layer 12 is a layer including a wire provided parallel to the xy plane. The first conductive layer 12 contains a conductive material such as copper (Cu). However, the conductive material is not limited to Cu. In FIG. 1, the first stacked board 10 includes first conductive layers 12a, 12b, and 12c. In addition, the number of first conductive layers 12 may be one, or the number of first conductive layers 12 may be plural.

The first insulating layer 16 is provided between the first conductive layer 12a and the first conductive layer 12b and between the first conductive layer 12b and the first conductive layer 12c. The first insulating layer 16 contains, for example, a thermosetting epoxy resin or the like. However, the type of resin is not particularly limited. In addition, the first insulating layer 16 may contain a ceramic or the like.

The first connection conductor 14 connects the first conductive layer 12a and the first conductive layer 12b or connects the first conductive layer 12b and the first conductive layer 12c. The first connection conductor 14 is, for example, a via provided parallel to the z direction. The first connection conductor 14 contains a conductive material such as copper (Cu). However, the conductive material is not limited to Cu.

The second stacked board 20 is provided on a first region 92 on the first stacked board 10. The second stacked board 20 includes a second conductive layer 22, a second connection conductor 24, and a second insulating layer 26.

The second conductive layer 22 is a layer including a wire provided parallel to the xy plane. The second conductive layer 22 contains a conductive material such as copper (Cu). However, the conductive material is not limited to Cu. In FIG. 1, the second stacked board 20 includes second conductive layers 22a, 22b, and 22c. In addition, the number of second conductive layers 22 may be one, or the number of second conductive layers 22 may be plural.

The second insulating layer 26 is provided between the second conductive layer 22a and the second conductive layer 22b and between the second conductive layer 22b and the second conductive layer 22c. The second insulating layer 26 contains, for example, a thermosetting epoxy resin. However, the type of resin is not particularly limited. The second insulating layer 26 may contain a ceramic or the like.

The second connection conductor 24 connects the second conductive layer 22a and the second conductive layer 22b or connects the second conductive layer 22b and the second conductive layer 22c. The second connection conductor 24 is, for example, a via provided parallel to the z direction. The second connection conductor 24 contains a conductive material such as copper (Cu). However, the conductive material is not limited to Cu.

The third stacked board 30 is provided on the second region 94 on the first stacked board 10. The third stacked board 30 includes a third conductive layer 32, a third connection conductor 34, and a third insulating layer 36.

The third conductive layer 32 is a layer including a wire provided parallel to the xy plane. The third conductive layer 32 contains a conductive material such as copper (Cu). However, the conductive material is not limited to Cu. In FIG. 1, the third stacked board 30 includes third conductive layers 32a, 32b, and 32c. In addition, the number of third conductive layers 32 may be one, or the number of third conductive layers 32 may be plural.

The third insulating layer 36 is provided between the third conductive layer 32a and the third conductive layer 32b and between the third conductive layer 32b and the third conductive layer 32c. The third insulating layer 36 contains, for example, a thermosetting epoxy resin or the like. However, the type of resin is not particularly limited. The third insulating layer 36 may contain a ceramic or the like.

The third connection conductor 34 connects the third conductive layer 32a and the third conductive layer 32b or connects the third conductive layer 32b and the third conductive layer 32c. The third connection conductor 34 is, for example, a via provided parallel to the z direction. The third connection conductor 34 contains a conductive material such as copper (Cu). However, the conductive material is not limited to Cu.

The connection between the second conductive layer 22 and the first conductive layer 12 is performed by using, for example, the second connection conductor 24. In addition, the connection between the third conductive layer 32 and the first conductive layer 12 is performed by using, for example, the third connection conductor 34. However, the connection may be performed by using, for example, solder balls or the like provided on the first stacked board 10.

The magnetic measurement element 50 is provided in a third region 96 on the first stacked board 10 between the first region 92 and the second region 94. A cavity 90 is formed in the third region 96. The magnetic measurement element 50 is, for example, a Hall element. The magnetic measurement element 50 is connected to the first conductive layer 12c by using, for example, a solder 52. The magnetic measurement element 50 is not limited to the hall element, but the magnetic measurement element 50 may be, for example, a magnetoresistance effect element such as a giant magnetoresistance effect element, an anisotropic magnetoresistance effect element, or a tunnel magnetoresistance effect element. In addition, the magnetic measurement element 50 may be in contact with the first insulating layer 16, the second insulating layer 26, and the third insulating layer 36.

In the manufacturing of the first stacked board 10, the second stacked board 20, and the third stacked board 30, for example, after the first stacked board 10, the second stacked board 20, and the third stacked board 30 are separately formed, the first stacked board 10 and the second stacked board 20 may be adhered, and the first stacked board 10 and the third stacked board 30 may be adhered. As described above, the process of manufacturing the first stacked board 10, the second stacked board 20, and the third stacked board 30 is not particularly limited.

The fourth stacked board 40 is provided on or above the magnetic measurement element 50 between the second stacked board 20 and the third stacked board 30. Although the fourth stacked board 40 is illustrated above the second stacked board 20 and the third stacked board 30 in FIG. 1, the fourth stacked board 40 is fixed between the second stacked board 20 and the third stacked board 30 as described later. The fourth stacked board 40 includes fourth conductive layers 42a and 42b and a fourth insulating layer 46.

The fourth conductive layer 42 is a layer including a wire provided parallel to the xy plane. The fourth conductive layer 42 contains a conductive material such as copper (Cu). However, the conductive material is not limited to Cu. In FIG. 1, the fourth stacked board 40 includes the fourth conductive layers 42a and 42b. In addition, the number of fourth conductive layers 42 may be one, or the number of fourth conductive layers 42 may be plural.

The fourth insulating layer 46 is provided between the fourth conductive layer 42a and the fourth conductive layer 42b. The fourth insulating layer 46 contains, for example, a thermosetting epoxy resin or the like. However, the type of resin is not particularly limited. The fourth insulating layer 46 may contain a ceramic or the like.

The first stacked board 10 and the fourth stacked board 40 may be provided with holes penetrating from the outside of the current detection device 100 to the cavity 90 in order to improve the reliability.

In addition, the first stacked board 10, the second stacked board 20, the third stacked board 30, and the fourth stacked board 40 in the present embodiment are low temperature co-fired ceramics (LTCC) and are multilayer circuit boards.

Figure 2A:
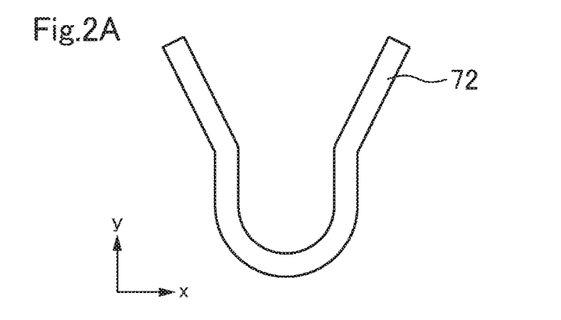
FIGS. 2A to 2E are schematic cross-sectional views of main components of a current detection device according to the first embodiment.
Figure 2B:
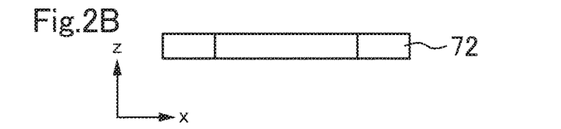

FIGS. 2A to 2E are schematic cross-sectional views of the main components of the current detection device according to the present embodiment. FIG. 2A is a schematic top view of the first coil 72 of the present embodiment. FIG. 2B is a schematic side view of the first coil 72 of the present embodiment. The first coil 72 is a one-turn coil having a planar shape. In addition, for example, the second coil 74 also has the same shape as the first coil 72. The first coil 72 is provided on the first conductive layer 12a (FIG. 1), and the second coil 74 is provided on the fourth conductive layer 42b (FIG. 1). The first coil 72 and the second coil 74 are not limited to a one-turn coil. In a case where it is desired to increase the number of turns, the number of layers can be increased to configure the first coil 72 and the second coil 74.

A first shield 76 is provided on the first conductive layer 12b between the first coil 72 and the magnetic measurement element 50. The first shield 76 contains a conductive material such as copper (Cu). However, the conductive material is not limited to Cu. The first shield 76 is connected to the ground, for example, through the first connection conductor 14 or the like.

A second shield 78 is provided on the fourth conductive layer 42a between the second coil 74 and the magnetic measurement element 50. The first shield 76 contains a conductive material such as copper (Cu). However, the conductive material is not limited to Cu. The second shield 78 is connected to the ground.

In addition, with respect to the shields, both the first shield 76 and the second shield 78 may not be provided. For example, only the first shield 76 or only the second shield 78 may be provided. In addition, with respect to the coils, both the first coil 72 and the second coil 74 may not be provided. For example, only the first coil 72 or only the second coil may be provided.

Figure 2C:
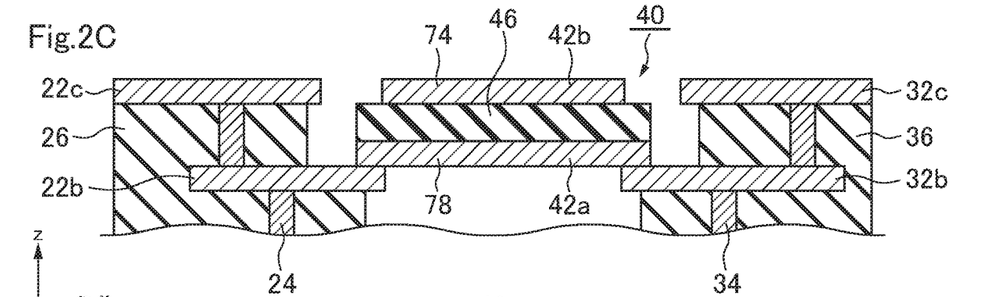
Figure 2D:
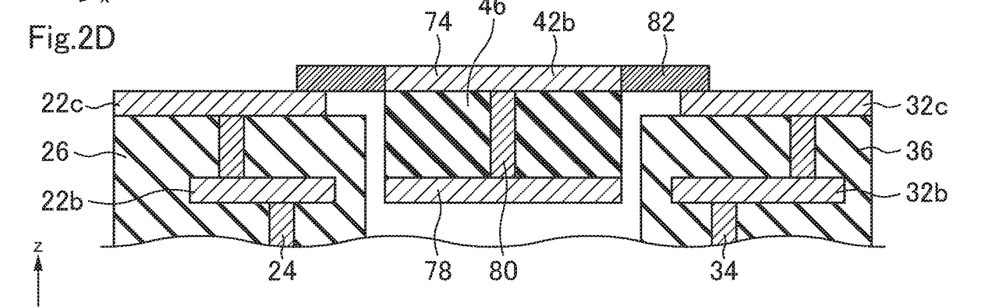
Figure 2E:
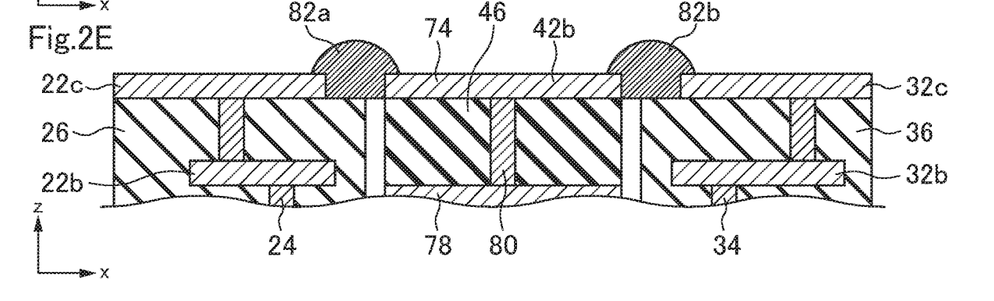

FIGS. 2C to 2E are schematic cross-sectional views illustrating a pattern of the connection of the second shield 78.

In FIG. 2C, the second shield 78 is provided on the second conductive layer 22b and is electrically connected to the second conductive layer 22b. The second shield 78 is provided on the third conductive layer 32b and is electrically connected to the third conductive layer 32b. Then, the second shield 78 is connected to the second conductive layer 22b and the third conductive layer 32b and to the ground, for example, through a wire (not illustrated). In addition, the second shield 78 may not be electrically connected to both the second conductive layer 22b and the third conductive layer 32b. For example, the second shield 78 may be electrically connected to the second conductive layer 22b and may not be connected to the third conductive layer 32b. Conversely, for example, the second shield 78 may be electrically connected to the third conductive layer 32b and may not be electrically connected to the second conductive layer 22 b.

In FIG. 2D, the second shield 78 and the fourth conductive layer 42b are electrically connected to each other through a via 80. The fourth conductive layer 42b has an extension portion 82 and is electrically connected to the second conductive layer 22c and the third conductive layer 32c through the extension portion 82. Then, the second shield 78 is connected to the ground through the extension portion 82, the third conductive layer 32c, and for example, a wire (not illustrated). In addition, the second shield 78 is connected to the ground through the extension portion 82, the second conductive layer 22c, and for example, a wire (not illustrated).

In FIG. 2E, unlike in FIG. 2D, the fourth conductive layer 42b is electrically connected to the second conductive layer 22c and the third conductive layer 32c through a bonding portion 82a and a bonding portion 82b instead of the extension portion 82. The bonding portion 82a and the bonding portion 82b are made of, for example, solders, but are not limited to the solders.

A current to be measured flows in the first coil 72 and the second coil 74. For example, the first coil 72 and the second coil 74 are connected through a wire (not illustrated), and a current flows in the first coil 72 and the second coil 74 so that the magnetic field generated from the first coil 72 and the magnetic field generated from the second coil 74 are in the same direction. The magnetic measurement element 50 is, for example, a Hall element as described above.

Next, applications of the current detection device 100 according to the present embodiment will be described. The current detection device 100 according to the present embodiment is used for current detection. For example, a driving circuit (not illustrated) of the magnetic measurement element 50 and an amplifier (not illustrated) are provided around the current detection device 100. The driving circuit supplies, for example, an operating voltage of the magnetic measurement element 50 to operate the magnetic measurement element 50. In addition, the driving circuit supplies, for example, an operating voltage of the amplifier to operate the amplifier. For example, in a case where the magnetic measurement element 50 is a Hall element, a voltage generated by the magnetic field measured by the Hall element is measured after being amplified by the amplifier and is converted to a current. In this manner, the current can be measured by the current detection device 100. The current detection device 100 according to the present embodiment is used for an AC/DC adapter, a control device for a general-purpose inverter or a variable motor speed device, overcurrent protection of a power module, and the like.

Next, the functions and effects of the present embodiment will be described.

Figure 3:
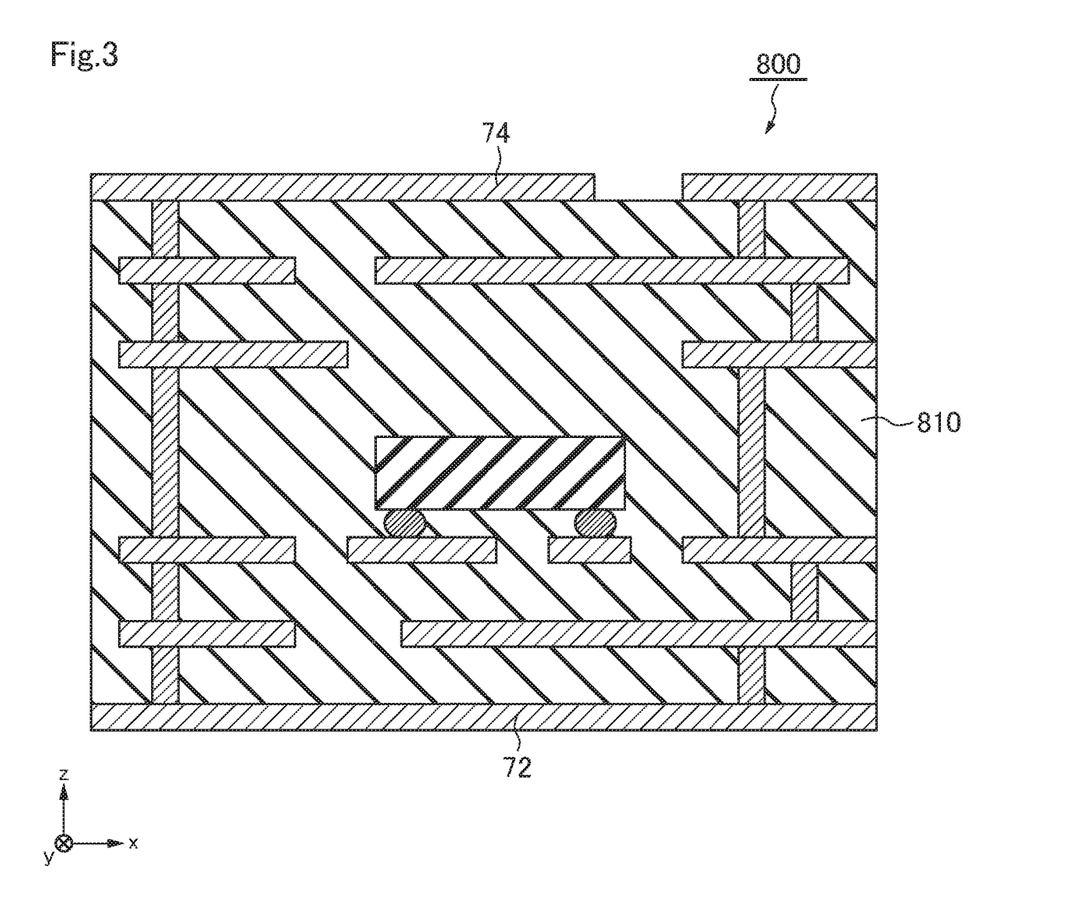
FIG. 3 is a schematic cross-sectional view of a current detection device according to Comparative Example of the first embodiment.

FIG. 3 is a schematic cross-sectional view of a current detection device 800 according to Comparative Example of the present embodiment. The current detection device 800 is manufactured by a manufacturing method in which a core layer 810 including the magnetic measurement element 50 is formed first, and after that, an insulating layer and a conductive layer are formed on the upper and lower sides of the core layer 810. In this case, there is a problem in that the magnetic measurement element 50 cannot be mounted depending on the thickness of the core layer 810. In addition, in a case where the thickness of the insulating layer to be the core layer 810 is large, since the distance between the first coil 72 and the magnetic measurement element 50 and the distance between the second coil 74 and the magnetic measurement element 50 become large, the magnitude of the magnetic field measured by the magnetic measurement element 50 becomes small, and as a result, there is a problem in that the sensitivity of the current detection is lowered. In addition, for example, in a case where the magnetic measurement element 50 is connected to the conductive layer by using a solder, after the magnetic measurement element 50 is connected to the conductive layer by the solder, an insulating layer to be the core layer 810 is formed around the magnetic measurement element 50 including solder. For this reason, there is a problem in that, after the insulating layer to be the core layer 810 is formed, it is necessary to evaluate whether the magnetic measurement element 50 operates reliably, whether the solder is reliable, or the like.

Figure 4:
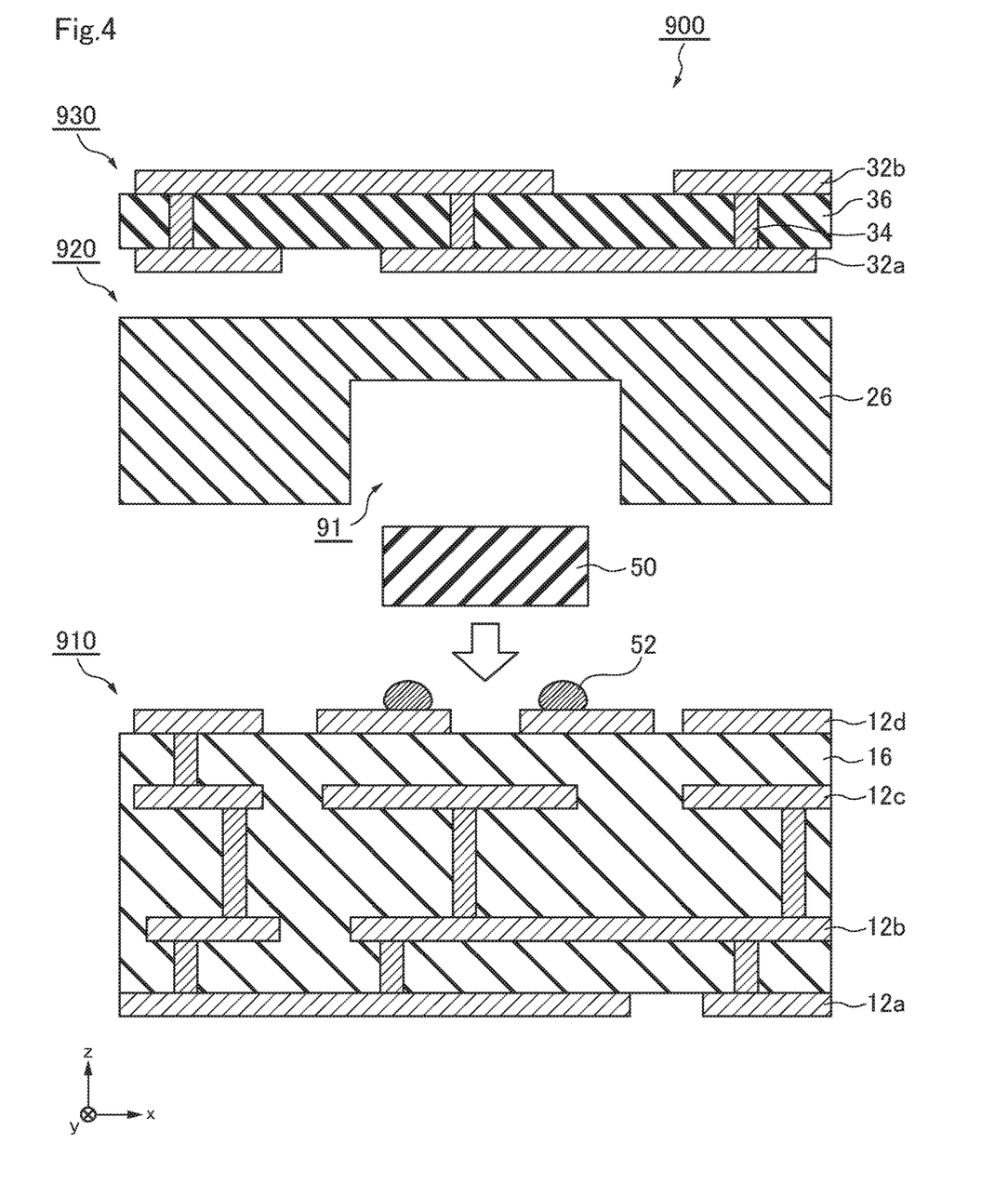
FIG. 4 is a schematic cross-sectional view of a current detection device according to Comparative Example of the first embodiment.

FIG. 4 is a schematic cross-sectional view of a current detection device 900 according to Comparative Example of the present embodiment. In the process of manufacturing the current detection device 900, first, the magnetic measurement element 50 is electrically connected to a first conductive layer 12d by using a solder 52 provided on a stacked board 910. Next, a second insulating layer 26 is bonded onto the first conductive layer 12d so that the magnetic measurement element 50 is accommodated in a cavity 91. Next, a stacked board 930 is bonded onto the second insulating layer 26. As a result, the current detection device 900 is manufactured.

In the current detection device 900, since the magnetic measurement element 50 is provided in the cavity 91, there is an advantage in that surface mounting on the first conductive layer 12d using the solder 52 can be easily performed. In addition, since it is easier to remove a layer which is not required than the case of the current detection device 800, there is an advantage in that the distance between the first coil 72 and the second coil 74 can be easily reduced. However, in order to improve adhesion between the first conductive layer 12d and the second insulating layer 26, and between the third conductive layer 32a and the second insulating layer 26, it is desirable that a mesh-shaped ground (mesh ground or ground mesh) is provided on the first conductive layer 12d and the third conductive layer 32a. However, in some cases, the mesh-shaped ground may not have sufficient noise removal performance, and thus, there is a problem in that there is a design limitation.

In the current detection device 100 according to the present embodiment, the magnetic measurement element 50 is provided in the third region 96 on the first stacked board 10. The magnetic measurement element is provided between the first region 92 and the second region 94. The cavity 90 is formed around the magnetic measurement element 50. Furthermore, the fourth stacked board 40 is provided between the second stacked board 20 and the third stacked board 30 on the magnetic measurement element 50. In this case, the cavity 90 is formed around the magnetic measurement element 50, and the insulating layer is not provided. For this reason, the burden of the evaluation after manufacturing the current detection device 100, such as whether the magnetic measurement element 50 operates reliably or whether the solder is reliable is reduced. In addition, unlike the current detection device 900 illustrated in FIG. 4, since it is not necessary to use a mesh-shaped ground, there is no limitation in design, and the effect of noise removal can also be sufficiently achieved. For this reason, it is possible to provide a high-performance current detection device that can be easily manufactured.

Since both of the first coil 72 and the second coil 74 are provided, the magnitude of the magnetic field measured by the magnetic measurement element 50 is doubled even if the magnitude of the current is the same, so that it is possible to provide a higher-performance current detection device.

Since noise in the current detection device 100 is removed by the first shield 76 and the second shield 78, it is possible to provide a higher-performance current detection device.

According to the current detection device according to the present embodiment, it is possible to provide a high-performance current detection device that can be easily manufactured.

Second Embodiment

A current detection device according to the present embodiment is different from that of the first embodiment in that the magnetic measurement element is electrically connected to a second conductive layer or a third conductive layer through a wire. Herein, the same points as those of the first embodiment are omitted in description.

Figure 5:
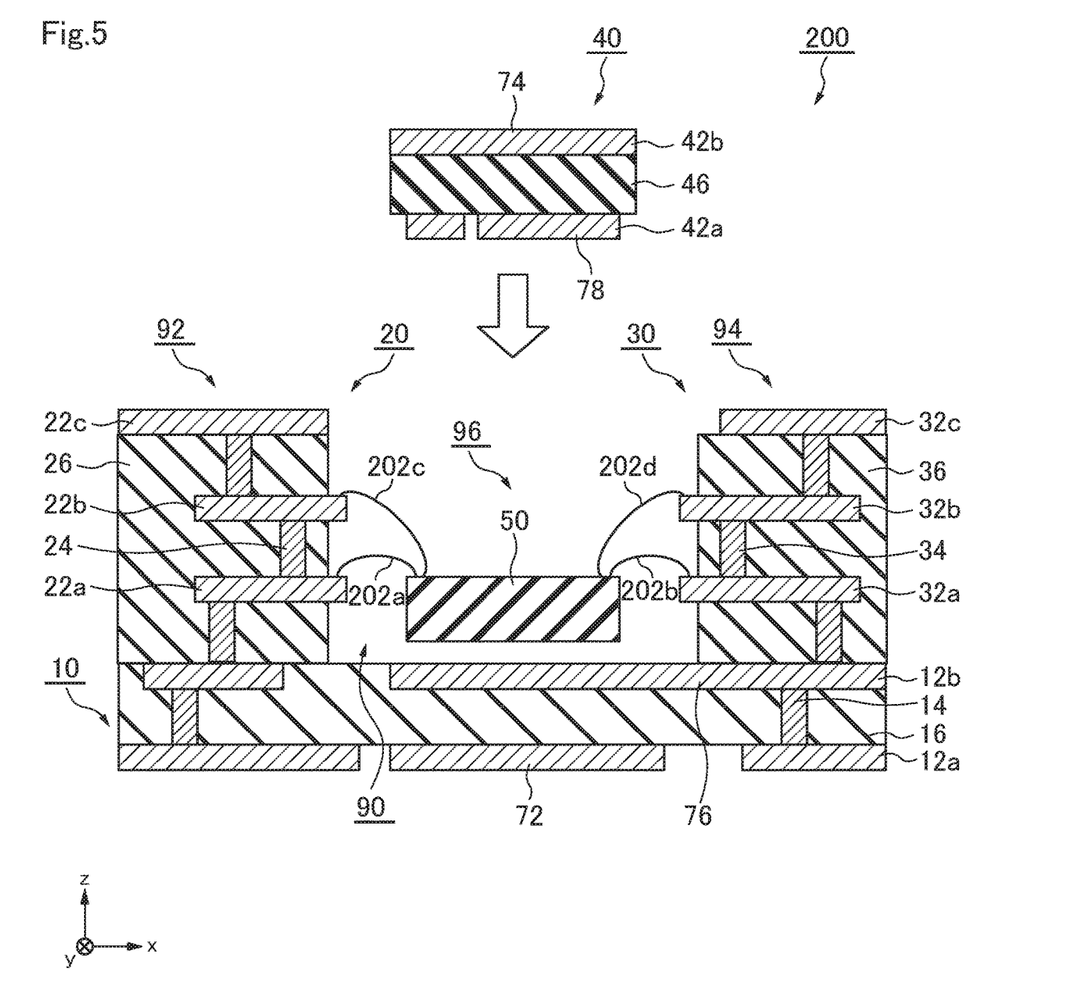
FIG. 5 is a schematic cross-sectional view of a current detection device according to a second embodiment.

FIG. 5 is a schematic cross-sectional view of the current detection device 200 according to the present embodiment. The magnetic measurement element 50 is electrically connected to the second conductive layer 22a through a wire 202a. In addition, the magnetic measurement element 50 is electrically connected to the third conductive layer 32a through a wire 202b. For example, in a case where the magnetic measurement element 50 is a Hall element, four-terminal connection of the Hall element is performed through the wires 202a, 202b, 202c, and 202d, and the current is measured from the measured voltage. In addition, the present embodiment can also be adapted to the case of a multi-terminal component in the same manner.

According to the current detection device 200, it is also possible to provide a high-performance current detection device that can be easily manufactured.

In addition, in the current detection device 200, electrical connection to the magnetic measurement element 50 can be performed without using the solder 52. Then, the number of conductive layers provided with the solder 52 can be further reduced, so that the distance between the shield and the magnetic measurement element and the distance between and the first coil and the magnetic measurement element can be further reduced. Therefore, the manufacturing cost can be reduced, and thus, it is possible to provide a higher-performance current detection device.

Third Embodiment

A current detection device according to the present embodiment is different from the first and second embodiments in that the magnetic measurement element 50 is provided below the fourth stacked board. Herein, the same points as those of the first and second embodiments are omitted in description.

The current detection device 300 according to the present embodiment includes a first stacked board, a second stacked board provided on a first region on the first stacked board, a third stacked board provided on a second region on the first stacked board, a fourth stacked board provided between the second stacked board and the third stacked board, a magnetic measurement element provided below the fourth stacked board and electrically connected to the fourth stacked board, and a first coil provided on or above the magnetic measurement element or below the magnetic measurement element.

Figure 6:
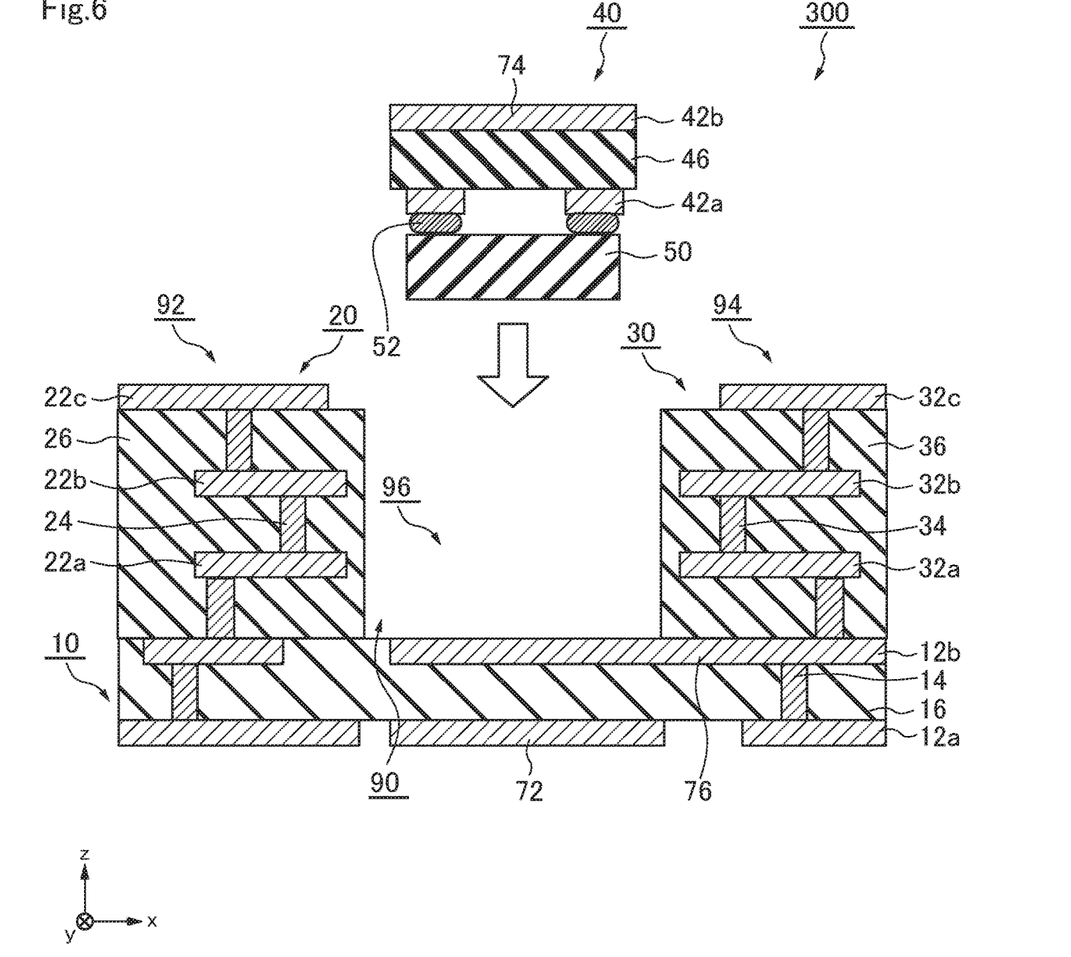
FIG. 6 is a schematic cross-sectional view of a current detection device according to a third embodiment.

FIG. 6 is a schematic view of the current detection device 300 according to the present embodiment. The magnetic measurement element 50 is electrically connected to the fourth conductive layer 42 by using, for example, a solder 52. In addition, the magnetic measurement element 50 may be electrically connected to the fourth conductive layer 42 by using a wire.

The first and second shields (not illustrated) may be provided in the same manner as the current detection devices according to the first and second embodiments.

According to the current detection device 300, it is also it possible to provide a high-performance current detection device that can be easily manufactured.

While certain embodiments have been described, these embodiments have been presented by way of example only, and are not intended to limit the scope of the inventions. Indeed, current detection devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A current detection device comprising:
   a first stacked board;
   a second stacked board provided on a first region on the first stacked board;
   a third stacked board provided on a second region on the first stacked board;
   a fourth stacked board provided between the second stacked board and the third stacked board;
   a hall element provided in a third region on the first stacked board, the hall element provided between the first region and the second region;
   a first coil provided below the hall element;
   a second coil, wherein the hall element is provided between the first coil and the second coil;
   a first shield provided between the first coil and the hall element; and
   a second shield provided between the second coil and the hall element.

2. The current detection device according to claim 1, wherein the first stacked board includes a plurality of first conductive layers and a first insulating layer provided between the first conductive layers, and
   wherein the hall element is electrically connected to the first conductive layers.

3. The current detection device according to claim 2, wherein the plurality of first conductive layers is in direct contact with edges of the hall element.

4. The current detection device according to claim 1, wherein the second stacked board includes a plurality of second conductive layers and a second insulating layer provided between the second conductive layers, and
   wherein the hall element is electrically connected to the second conductive layers by using a wire.

5. The current detection device according to claim 1, further comprising the first shield provided between the first coil and the hall element, the first shield including a conductive material.

6. The current detection device according to claim 1, further comprising the fourth stacked board provided between the second stacked board and the third stacked board, the fourth stacked board being provided on the hall element.

7. The current detection device according to claim 1, wherein a cavity is formed in the third region.

8. The current detection device according to claim 1, wherein the first stacked board, the second stacked board, or the third stacked board is a low temperature co-fired ceramics (LTCC).

9. The current detection device according to claim 1, wherein the first stacked board, the second stacked board and the third stacked board are provided between the first coil and the second coil.

10. A current detection device comprising:
a first stacked board;
a second stacked board provided on a first region on the first stacked board;
a third stacked board provided on a second region on the first stacked board;
a fourth stacked board provided between the second stacked board and the third stacked board;
a hall element provided below the fourth stacked board and electrically connected to the fourth stacked board;
a first coil provided below the hall element;
a first shield provided between the first coil and the hall element; and
a second shield provided between a second coil and the hall element.

11. The current detection device according to claim 10, wherein the hall element is provided between the first coil and the second coil.

12. The current detection device according to claim 10, wherein the first shield includes a conductive material.

13. The current detection device according to claim 10, wherein a cavity is formed in a third region on the first stacked board, the third region being provided between the first region and the second region.

14. The current detection device according to claim 10, wherein the first stacked board, the second stacked board, the third stacked board, or the fourth stacked board is a low temperature co-fired ceramics (LTCC).

15. The current detection device according to claim 10, wherein the hall element is connected to a via of the fourth stacked board.

16. The current detection device according to claim 10, wherein the first stacked board, the second stacked board and the third stacked board are between the first coil and the second coil.

17. A current detection device comprising:
a first stacked board;
a second stacked board provided on a first region on the first stacked board;
a third stacked board provided on a second region on the first stacked board;
a fourth stacked board provided between the second stacked board and the third stacked board;
a hall element provided below the fourth stacked board and electrically connected to the fourth stacked board;
a first coil provided below the hall element; and
a second coil provided on the fourth stacked board, and the hall element being provided between the first coil and the second coil.

* * * * *